United States Patent [19]

Dougherty et al.

[11] Patent Number: 5,144,266
[45] Date of Patent: Sep. 1, 1992

[54] BROADBAND HIGH FREQUENCY ACTIVE MMIC CIRCULATOR

[75] Inventors: Richard M. Dougherty, Scottsdale; Stephen W. Boser, Phoenix, both of Ariz.

[73] Assignee: Motorola, Inc., Schaumburg, Ill.

[21] Appl. No.: 650,120

[22] Filed: Feb. 4, 1991

[51] Int. Cl.$^5$ .............................................. H03H 11/38
[52] U.S. Cl. ....................................... 333/1; 333/1.1; 330/277; 330/311
[58] Field of Search ....................... 333/1, 1.1; 328/103

[56] References Cited

U.S. PATENT DOCUMENTS 3,860,893  1/1975  Ropars et al. ................... 333/1.1 X

FOREIGN PATENT DOCUMENTS 090713  3/1990  Japan ............................ 333/1.1

Primary Examiner—Paul Gensler
Attorney, Agent, or Firm—Frank J. Bogacz

[57] ABSTRACT

A broadband high frequency active MMIC circulator which includes low parasitic devices (MESFETs or HEMTs) and shunt feedback for impedance contouring in conjunction with a cascode/cascade isolation/gain network. To achieve circulation, a common series feedback node is required for each active element. While conventional active circulator topologies require the use of a resistive element for operation with a deleterious effect on noise performance, this broadband high frequency active MMIC circulator functions with either resistive or reactive common series feedback. When reactive feedback is selected, major improvements in noise performance can be realized.

12 Claims, 1 Drawing Sheet

BROADBAND HIGH FREQUENCY ACTIVE MMIC CIRCULATOR

BACKGROUND OF THE INVENTION

This invention relates in general to the field of electromagnetic signal circulators and in particular to active monolithic microwave integrated circuit (MMIC) circulators.

A circulator is a three-terminal device which passes signals input to one port to the next port in a rotational fashion (either clockwise or counterclockwise) without allowing signals to pass in the opposite rotation. Circulators are suitable for essentially any radio frequency (RF) application, including communications. Circulators are also useful as isolators, easily made by tying the third circulator port to ground through a resistor. Other applications involve radar (including phased array systems) and electronic counter measures (ECMs).

Microwave circulators can be accomplished passively or actively. Passive microwave circulation is accomplished using magnetics, or, at higher frequencies, waveguide magnetic structures. Both magnetic and waveguide magnetic techniques for microwave circulators suffer from relatively large physical size requirements. A passive magnetic circulator might comprise a volume five inches by five inches by two inches. Waveguides require even more space. Relatively high cost is associated with such relatively large physical size, and it has been especially uneconomical and impractical to use passive magnetic or waveguide microwave circulators in many applications.

Active microwave circulators can be realized in a relatively small physical space (e.g., approximately seventy mils square on a MMIC instead of the five inches by five inches by two inches for a comparable passive magnetic circulator). However, active circulators in general act as low pass devices, exhibit frequency limitations, and suffer from high insertion loss (e.g., insertion losses in the vicinity of 2.5 to 3.0 deciBels (dB) are typical). In addition, conventional active circulator topologies could benefit from enhanced noise performance.

The first techniques for active circulation demonstrated a bipolar design. While demonstrating multioctave bandwidth capability, this approach has been restricted in operational frequency range and is limited to low pass transfer functions. Implementation of active circulators in a gallium arsenide (GaAs) monolithic configuration has also been accomplished. However, with high (e.g., greater than 6 dB) insertion loss and no feedback for stabilization, the gallium arsenide monolithic configuration is still limited in performance. Furthermore, neither technique allows for configuring the passband, frequency range, and operating bandwidth of the active circulators.

Thus, a practical, economical circulator which overcomes the size and cost constraints of passive magnetic or waveguide circulators and which also overcomes the low pass characteristics, high insertion losses, and frequency limitations of conventional active circulators is highly desirable. The circulator should employ a topology which allows for a configurable passband, frequency range, and operating bandwidth for increased versatility. The structure should be able to transcend the high noise figure exhibited by conventional active circulators for increased utility in a wide variety of applications.

SUMMARY OF THE INVENTION

Accordingly, it is an advantage of the present invention to provide a new and improved apparatus for the circulation of electromagnetic signals. It is a further advantage of the present invention to provide for active circulation which overcomes the low pass characteristics, high insertion losses, frequency and noise limitations of conventional active circulators. It is still a further advantage of the present invention to provide for an active circulator which allows for a configurable passband, frequency range, and operating bandwidth.

To achieve these advantages, a broadband high frequency active MMIC circulator is contemplated which includes low parasitic devices (e.g., small geometry metal semiconductor field effect transistors (MESFETs) or high electron mobility transistors (HEMTs) and shunt feedback for impedance contouring in conjunction with a combination cascode and cascade network to provide isolation and gain. In order to achieve circulation, a common feedback node is provided for each active element. While conventional active circulator topologies require the use of a resistive element for operation, resistive elements have a negative effect on noise performance. An advantage of this broadband high frequency active MMIC circulator is its ability to function with either resistive or reactive common series feedback. When reactive feedback is selected, major improvements in noise performance can be realized.

The above and other features and advantages of the present invention will be better understood from the following detailed description taken in conjunction with the accompanying drawings.

DETAILED DESCRIPTION OF THE PREFERRED EMBODIMENT

Figure 1:
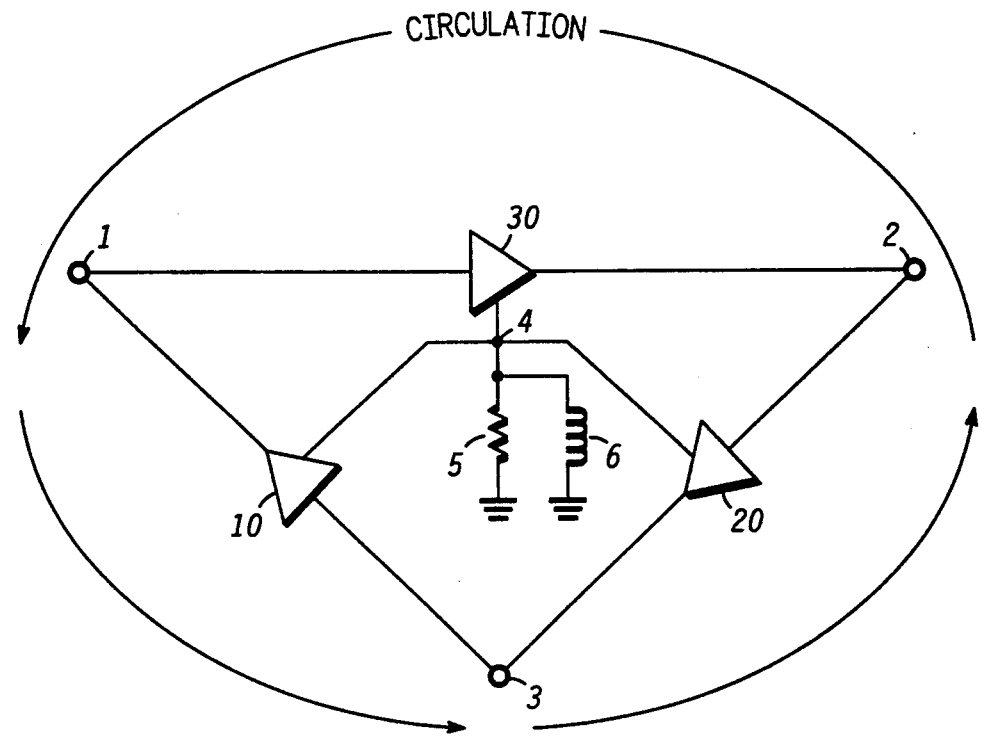
In FIG. 1 there is shown a circuit schematic of the preferred embodiment of the invention.

In FIG. 1, there is shown a circuit schematic of the three-port broadband high frequency active MMIC circulator. Ports 1, 2, and 3 interconnect the active circulator elements 10, 20, and 30. Active circulator elements 10, 20, and 30 each have three active circulator element nodes. Active circulator element 10 has active circulator element nodes 1, 3, and 4. Active circulator element nodes 1 and 3 function as first and third ports, respectively, of the three-port broadband high-frequency active MMIC circulator. Active circulator element node 4 is a common node.

Active circulator element 20 has active circulator element nodes 2, 3, and 4. Active circulator element nodes 2 and 3 function as second and third ports, respectively, of the three-port broadband high-frequency active MMIC circulator. The third MMIC circulator port for active circulator element 20 is the same third MMIC circulator port as for active circulator element 10. Active circulator element node 4 is a common node, the same common node as for active circulator element 10.

Active circulator element 30 has active circulator element nodes 1, 2, and 4. Active circulator element nodes 1 and 2 function as first and second ports, respectively, of the three-port broadband high-frequency active MMIC circulator. The first MMIC circulator port for active circulator element 30 is the same first MMIC circulator port as for active circulator element 10. The second MMIC circulator port for active circulator element 30 is the same second MMIC circulator port as for active circulator element 20. Active circulator element node 4 is a common node, the same common node as for active circulator element 10 and active circulator element 20.

As indicated in FIG. 1, common node 4 is tied to ground through the parallel connection of resistor 5 and optional inductor 6. Inclusion of optional inductor 6 provides reactive common series feedback and enhances the noise performance of the circulator.

In operation, the sense of one-way electromagnetic signal circulation is in a counterclockwise rotation on the drawing, as indicated by the arrow in FIG. 1. Thus, a signal input to port 1 will be circulated to port 3, a signal input to port 3 will be circulated to port 2, and a signal input to port 2 will be circulated to port 1.

Figure 2:
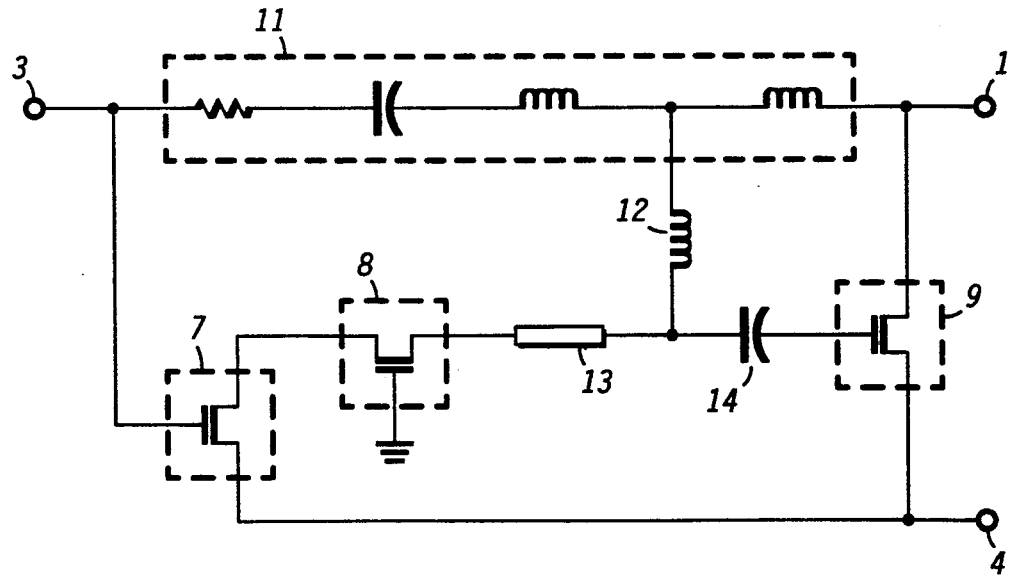
In FIG. 2, there is shown a circuit schematic of active element 10 of FIG. 1.

The choice of a new active element structure for elements 10, 20, and 30 forms the basis of this new active circulator. FIG. 2 shows a schematic of the circuit design for element 10. The three nodes 1, 3, and 4 correspond to the circulator ports 1 and 3 and common node 4 in the circuit connections in FIG. 1. Thus, one-way signal circulation is such that a signal input to node 1 is circulated to node 3 for active circulator element 10. The component structure for active circulator elements 20 and 30 is identical to that for active circulator element 10, but the FIG. 2 structure connects between ports 3 and 2 for active circulator element 20 and between ports 2 and 1 for active circulator element 30. Common node 4 is identical for all three active circulator elements 10, 20, and 30.

The structure of active circulator element 10 in FIG. 2 consists of a combination cascode and cascade network to provide the necessary isolation and gain. In the preferred embodiment of the invention, MESFET 7 and MESFET 8 comprise the cascode element. The source of MESFET 7 is connected to the common node 4. The gate of MESFET 7 is connected to circulator port 3. The drain of MESFET 7 is coupled to the source of MESFET 8. The gate of MESFET 8 is electrically grounded. The drain of MESFET 8 is configured in cascade fashion with MESFET 9 by connecting through transmission line 13 and capacitor 14 into the gate of MESFET 9. The source of MESFET 9 is coupled to the common node 4, and a feedback contouring network 11 is used to simplify the drain bias injection of the cascode element, MESFET 7 and MESFET 8, by use of an inductor tap 12 from the feedback contouring network 11, which connects between transmission line 13 and capacitor 14. The drain of MESFET 9 is connected to circulator port 1.

In implementing the active circulator element 10 represented in FIG. 2, trade-off optimizations can be made between desired insertion loss and isolation. The use of MESFETs 7, 8, and 9 in the preferred embodiment of the invention allows gate peripherals to be changed in addition to the resistance and inductances of the feedback contouring network 11. Larger gate periphery affects parasitic capacitance and allows selective contouring of insertion loss, isolation, and bandwidth band pass structure. The performance of the preferred embodiment of the invention includes less than 1 dB insertion loss and greater than $-30$ dB isolation at a frequency of approximately 22 GigaHertz (GHz). Thus, not only can the performance of active MMIC circulator contemplated be selectively contoured, but also that performance represents an improvement over the performance of passive magnetic circulators.

For higher frequency applications, i.e. where passive magnetic circulator means are replaced by more complicated waveguide magnetic systems, modulation doped field effect transistors (MODFETs), heterojunction bipolar transistors (HBTs) or MESFETs with lower gate peripherals can be used as components of the active circulator elements. Use of these components in active circulator elements can be accomplished without increasing the size of the active circulator.

The sense of one-way signal circulation can be reversed to a clockwise rotation on the drawing, opposite the direction as indicated by the arrow in FIG. 1 by reversing the non-common connections of each active circulator element 10, 20, and 30. Specifically, active circulator element 10 has non-common active circulator element nodes 1 and 3, active circulator element 20 has non-common active circulator element nodes 2 and 3, and active circulator element 30 has non-common active circulator element nodes 1 and 2. If active circulator element nodes 1 and 3 are connected to function as third and first ports, respectively, active circulator element nodes 2 and 3 are connected to function as third and second ports, respectively, and active circulator element nodes 1 and 2 are connected to function as second and first ports, respectively, of the three-port broadband high-frequency active MMIC circulator, the sense of the signal rotation will be made clockwise in the circulator. Thus, a signal input to port 1 will be circulated to port 2, a signal input to port 2 will be circulated to port 3, and a signal input to port 3 will be circulated to port 1.

A broadband high frequency active MMIC circulator has been described which overcomes specific problems and accomplishes certain advantages relative to prior art methods and mechanisms. The improvements over known technology are significant. The expense, size, and fixed performance constraints of passive magnetic and waveguide circulators are avoided. Similarly, the broadband high frequency active MMIC circulator contemplated offers considerable advantages over conventional active circulators, including: substantially lower insertion losses, higher operating frequencies, improved noise capabilities, and transfer functions other than low pass.

Thus, there has also been provided, in accordance with an embodiment of the invention, a broadband high frequency active MMIC circulator that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

We claim:

1. An active monolithic microwave integrated circuit (MMIC) signal circulator capable of high frequency performance with contourable bandpass characteristics, the active MMIC signal circulator having a plurality of at least three input/output ports and comprising:
   a first cascode network, wherein the first cascode network comprises a plurality of at least two transistors, the first cascode network including a first node coupled to the first input/output port, a second node coupled to the third input/output port, and a common node;

a second cascode network, wherein the second cascode network comprises a plurality of at least two transistors, the second cascode network including a first node coupled to the third input/output port, a second node coupled to the second input/output port, and a common node;

a third cascode network, wherein the third cascode network comprises a plurality of at least two transistors, the third cascode network including a first node coupled to the second input/output port, a second node coupled to the first input/output port, and a common node; and common feedback means coupled to each of the common nodes of the first cascode network, the second cascode network, and the third cascode network.

2. An active MMIC signal circulator of three input/output ports as claimed in claim 1 wherein the first cascode network, the second cascode network, and the third cascode network are each coupled to a cascade network.

3. An active MMIC signal circulator of three input/output ports as claimed in claim 2 wherein each of the cascode networks comprises a plurality of at least a first and a second cascade metal semiconductor field effect transistor (MESFET) wherein the first cascade MESFET comprises:

source means coupled to the common nodes of each of the first cascode network, the second cascode network, and the third cascode network;
gate means coupled to the third input/output port; and
drain means; and the second cascade MESFET comprises;
source means coupled to the drain means of the first cascode MESFET;
gate means connected to electrical ground; and
drain means.

4. An active MMIC signal circulator of three input/output ports as claimed in claim 3 wherein each of the cascode networks comprises at least one cascade MESFET wherein the cascade MESFET comprises:

source means coupled to the common nodes of each of the first cascode network, the second cascode network, and the third cascode network;
gate means; and
drain means coupled to the first input/output port.

5. An active MMIC signal circulator of three input/output ports as claimed in claim 4 wherein each cascade network is coupled to a feedback contouring network means comprised of three terminals wherein:

the first terminal of the feedback contouring network means is connected to the third input/output port;
the second terminal of the feedback contouring network means is connected to the first input/output port; and
the third terminal of the feedback contouring network means is coupled in series through an inductive tap to transmission means to the second cascode MESFET drain means.

6. An active MMIC signal circulator of three input/output ports as claimed in claim 5 wherein the common feedback means comprises at least one reactive element.

7. A broadband high frequency active monolithic microwave integrated circuit (MMIC) circulator with contourable bandpass characteristics, the broadband high frequency active MMIC circulator comprising:

common series feedback means connected to an electrical ground;
a plurality of at least three input/output ports;
a plurality of at least three isolation/gain means of the same number as and corresponding one for one to the plurality of input/output ports, wherein each isolation/gain means comprises a cascode network and is coupled to the common series feedback means and the plurality of isolation/gain means are electrically connected in a ring configuration alternating with the plurality of input/output ports so that each isolation/gain means is coupled to a unique pair of input/output ports.

8. A broadband high frequency active MMIC circulator as claimed in claim 7 wherein each isolation/gain means comprises a cascade network.

9. A broadband high frequency active MMIC circulator as claimed in claim 8 wherein the cascade network comprises a plurality of at least two metal semiconductor field effect transistors (MESFETs) wherein the first MESFET comprises:

source means coupled to the common nodes of each of the first isolation/gain means, second isolation/gain means, and the third isolation/gain means;
gate means coupled to the third input/output port; and
drain means;
and the second MESFET comprises:
source means coupled to the drain means of the first MESFET;
gate means connected to electrical ground; and
drain means.

10. A broadband high frequency active MMIC circulator as claimed in claim 9 wherein the cascade network comprises:

source means coupled to the common nodes of each of the first isolation/gain means, second isolation/gain means, and the third isolation/gain means;
gate means; and
drain means coupled to the first input/output port.

11. A broadband high frequency active MMIC circulator as claimed in claim 7 wherein the cascode network is coupled to a feedback contouring network means comprised of a first terminal, a second terminal, and a third terminal wherein:

the first terminal of the feedback contouring network means is connected to the third input/output port;
the second terminal of the feedback contouring network means is connected to the first input/output port; and
the third terminal of the feedback contouring network means is coupled in series through an inductive tap to transmission means to the second MESFET drain means of the cascode network.

12. A broadband high frequency active MMIC circulator as claimed in claim 7 wherein the common series feedback means comprises at least one reactive element.

* * * * *